United States Patent
Namkung

(10) Patent No.: US 10,186,688 B2
(45) Date of Patent: Jan. 22, 2019

(54) DISPLAY DEVICE

(71) Applicant: Samsung Display Co., Ltd., Yongin-si, Gyeonggi-do (KR)

(72) Inventor: Jun Namkung, Asan-si (KR)

(73) Assignee: Samsung Display Co., Ltd. (KR)

( * ) Notice: Subject to any disclaimer, the term of this patent is extended or adjusted under 35 U.S.C. 154(b) by 7 days.

(21) Appl. No.: 15/649,183

(22) Filed: Jul. 13, 2017

(65) Prior Publication Data
US 2018/0114951 A1    Apr. 26, 2018

(30) Foreign Application Priority Data

Oct. 26, 2016 (KR) .................. 10-2016-0140421

(51) Int. Cl.
  *H01L 51/52* (2006.01)
  *H01L 51/00* (2006.01)
  *H01L 27/32* (2006.01)

(52) U.S. Cl.
  CPC ...... *H01L 51/5281* (2013.01); *H01L 51/0097* (2013.01); *H01L 51/5253* (2013.01); *H01L 27/3244* (2013.01); *H01L 2251/5338* (2013.01)

(58) Field of Classification Search
  CPC . H01L 51/52; H01L 51/0097; H01L 51/5253; H01L 51/5281
  See application file for complete search history.

(56) References Cited

U.S. PATENT DOCUMENTS

| 9,287,329 | B1* | 3/2016 | Lee ..................... H01L 51/0097 |
| 2014/0176868 | A1* | 6/2014 | Zhu .................. B29D 11/00663 349/65 |
| 2016/0190522 | A1* | 6/2016 | Lee ..................... H01L 51/0097 257/40 |
| 2016/0205764 | A1* | 7/2016 | Namkung ........... H01L 51/0097 361/749 |
| 2016/0270209 | A1* | 9/2016 | Cho ...................... G06F 1/1652 |
| 2017/0336745 | A1* | 11/2017 | Watanabe ............ G03G 15/556 |

FOREIGN PATENT DOCUMENTS

| JP | 2003-043469 A | 2/2003 |
| KR | 10-2008-0055059 A | 6/2008 |
| KR | 20-2010-0002178 U | 3/2010 |
| KR | 10-2014-0080417 A | 6/2014 |

* cited by examiner

*Primary Examiner* — Fazli Erdem
(74) *Attorney, Agent, or Firm* — Innovation Counsel LLP

(57) ABSTRACT

An exemplary embodiment of the present disclosure provides a display device including: a substrate configured to include a display area and a peripheral area positioned at an outer circumference of the display area; a display member configured to be positioned on the substrate; an anti-reflective layer configured to be positioned on the display member; and a passivation layer configured to be positioned in a peripheral area of the substrate and to be adjacent to one end portion of the anti-reflective layer, wherein the anti-reflective layer may include a plurality of first lateral surfaces, and an area of one of the plurality of first lateral surfaces contacting the passivation layer may be larger than that of the anti-reflective layer cut in a direction parallel to one end portion of the anti-reflective layer.

20 Claims, 16 Drawing Sheets

DISPLAY DEVICE

CROSS-REFERENCE TO RELATED APPLICATION

This application claims priority to and the benefit of Korean Patent Application No. 10-2016-0140421 filed in the Korean Intellectual Property Office on Oct. 26, 2016, the entire contents of which are incorporated herein by reference.

BACKGROUND OF THE INVENTION (a) Field of the Invention

The present disclosure relates to a display device.

(b) Description of the Related Art

A display device includes an anti-reflective layer for improving visibility. Generally, the anti-reflective layer is attached to a display panel by a roller. When a process of attaching the anti-reflective layer is performed, even if a constant pressure is applied to the anti-reflective layer, there may be a difference between a pressure of a central portion thereof and pressures of opposite end portions thereof. Thus, a display panel positioned at a lower portion of the anti-reflective layer may be damaged to lead to a defect, thereby reducing manufacturing productivity of or degrading quality of the display panel. Accordingly, a structure that may prevent the display panel from being damaged in a manufacturing process of the display device is required.

The above information disclosed in this Background section is only for enhancement of understanding of the background of the invention and therefore it may contain information that does not form the prior art that is already known in this country to a person of ordinary skill in the art.

SUMMARY OF THE INVENTION

The present inventive concept has been made in an effort to provide a display device having a structure that may improve productivity by reducing a defect rate.

An exemplary embodiment of the present inventive concept provides a display device including: a substrate configured to include a display area and a peripheral area positioned at an outer circumference of the display area; a display member positioned on the substrate; an anti-reflective layer positioned on the display member; and a passivation layer positioned in a peripheral area of the substrate and to be adjacent to one end portion of the anti-reflective layer, wherein the anti-reflective layer may include a plurality of first lateral surfaces, and an area of one of the plurality of first lateral surfaces contacting the passivation layer may be larger than an area of a virtual surface of the anti-reflective layer, the virtual surface being a cut in the anti-reflective layer in a direction parallel to one end portion of the anti-reflective layer.

An area of at least one of the plurality of first lateral surfaces may be larger than an area of a virtual surface of the anti-reflective layer, the virtual surface being a cut in the anti-reflective layer in a direction parallel to one end portion of the anti-reflective layer including at least one first lateral surface, the virtual surface not intersecting the at least one first lateral surface.

At least one of the plurality of first lateral surfaces may include at least one chamfered corner.

A cross-sectional shape of the chamfered corner may be at least one of a straight line, a broken line, and a curved line.

At least one of the plurality of first lateral surfaces may be inclined with respect to the substrate.

The peripheral area may comprise with a bending area, and the anti-reflective layer may extend for the first lateral surface contacting the passivation layer to be positioned in the bending area.

The display device may further include a first adhesion layer positioned between the display member and the anti-reflective layer and to include a plurality of second lateral surfaces.

At least one of the plurality of second lateral surfaces may include at least one chamfered corner.

A vertical cross-sectional shape of the chamfered corner may be at least one of a straight line, a broken line, and a curved line.

At least one of the plurality of second lateral surfaces may be inclined with respect to the substrate.

The display device may further include a second adhesion layer configured to be positioned on the anti-reflective layer and to include a plurality of third lateral surfaces.

At least one of the plurality of third lateral surfaces may include at least one chamfered corner.

A vertical cross-sectional shape of the chamfered corner may be at least one of a straight line, a broken line, and a curved line.

At least one of the plurality of third lateral surfaces may be inclined with respect to the substrate.

The anti-reflective layer may be formed by a first optical film layer, a first protection film layer, a second optical film layer, and a second protection film layer being sequentially stacked based on the display member.

The first protection film layer may include a plurality of fourth lateral surfaces, and at least one of the plurality of fourth lateral surfaces may include at least one chamfered corner.

The first protection film layer may include a plurality of fourth lateral surfaces, and at least one of the plurality of fourth lateral surfaces may be inclined with respect to the substrate.

The second protection film layer may include a plurality of fifth lateral surfaces, and at least one of the plurality of fifth lateral surfaces may include at least one chamfered corner.

The second protection film layer may include a plurality of fifth lateral surfaces, and at least one of the plurality of fifth lateral surfaces may be inclined with respect to the substrate.

At least one of a plurality of lateral surfaces of the substrate, at least one of a plurality of lateral surfaces of the display member, and at least one of the plurality of first lateral surfaces of the anti-reflective layer may be positioned in a same vertical plane.

According to the embodiment of the present inventive concept, it is possible to ensure excellent quality and to dramatically reduce a defect rate by preventing the display panel from being damaged during a manufacturing process.

DETAILED DESCRIPTION OF THE EMBODIMENTS

Figure 1:
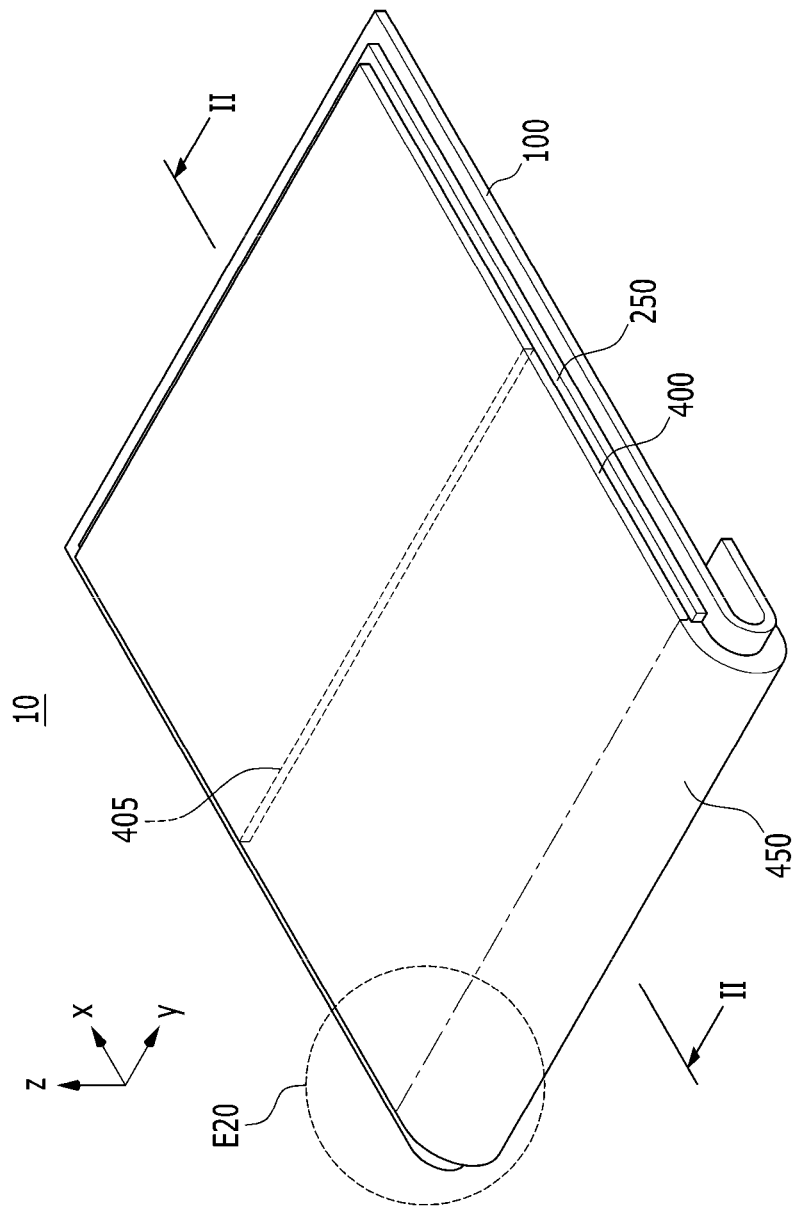
FIG. 1 illustrates a perspective view of a display device according to an exemplary embodiment.

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present inventive concept. The drawings and description are to be regarded as illustrative in nature and not restrictive. Like reference numerals designate like elements throughout the specification.

The size and thickness of each component shown in the drawings are arbitrarily shown for better understanding and ease of description, but the present inventive concept is not limited thereto. In the drawings, the thickness of layers, films, panels, regions, etc., are exaggerated for clarity. For better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout the specification, the phrase "in a plan view" means viewing the object portion from the top, and the phrase "in a cross-sectional view" means viewing a cross-section of which the object portion is vertically cut from the side.

Hereinafter, a display device according to an exemplary embodiment of the present disclosure will be described in detail with reference to the accompanying drawings.

Figure 2:
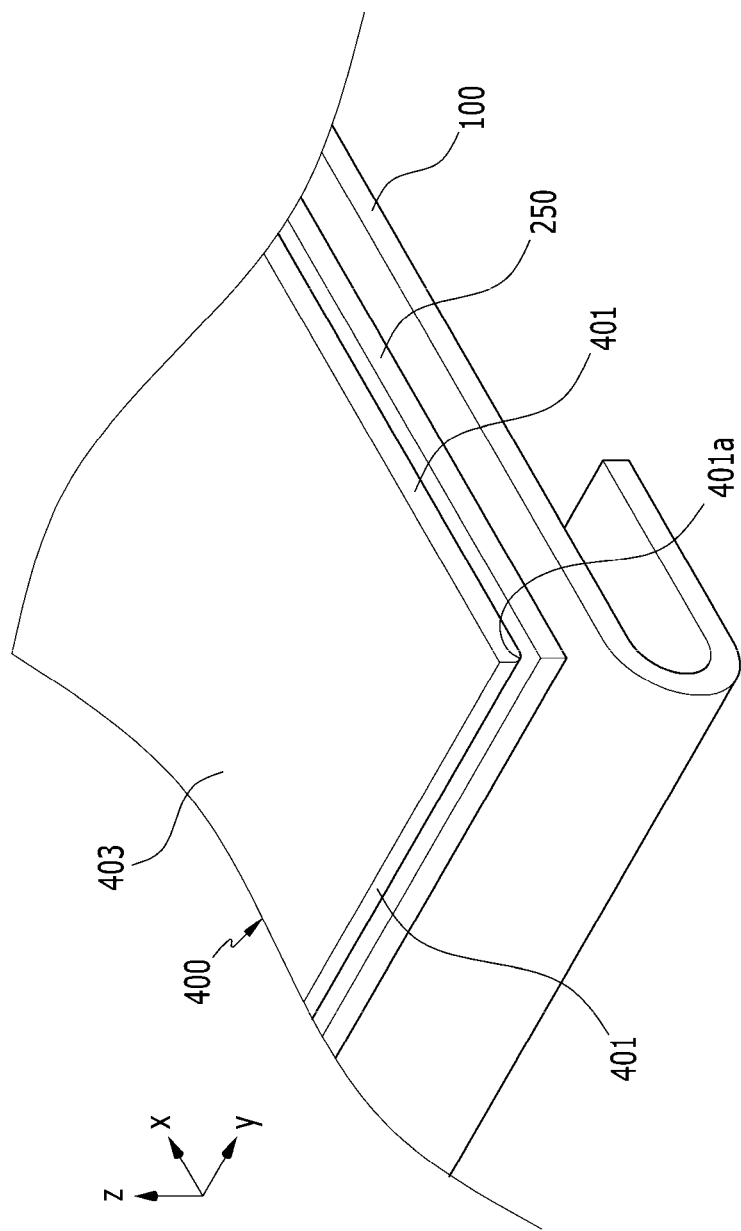
FIG. 2 illustrates an enlarged view of some of the display device of FIG. 1 from which a passivation layer is removed.
Figure 3:
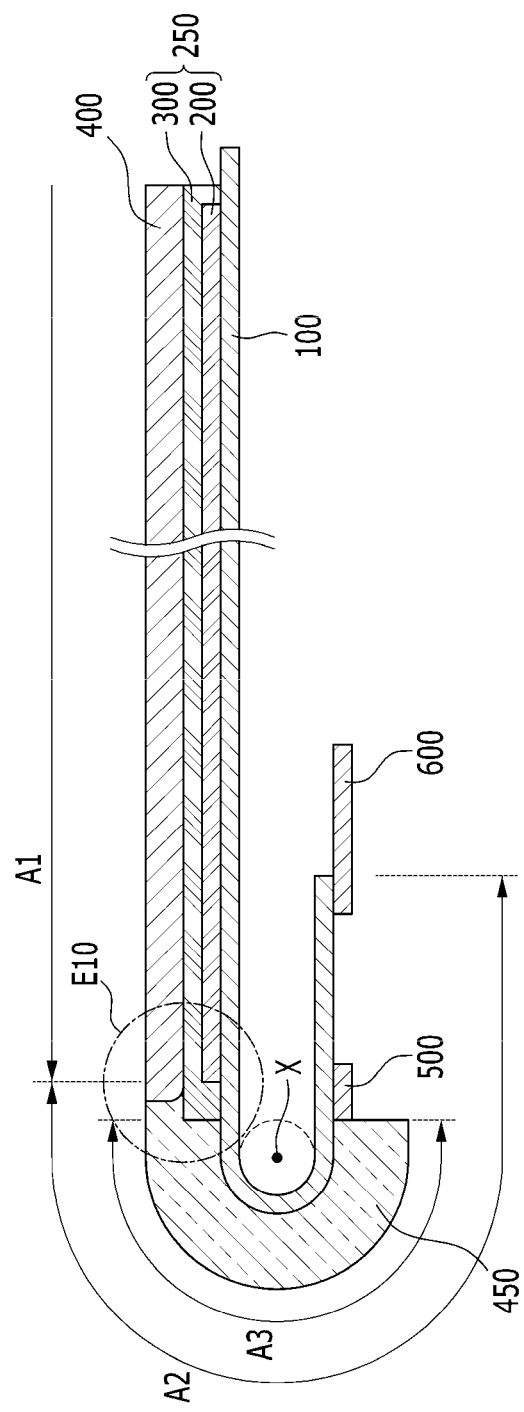
FIG. 3 illustrates a cross-sectional view taken along line II-II of FIG. 1.
Figure 4:
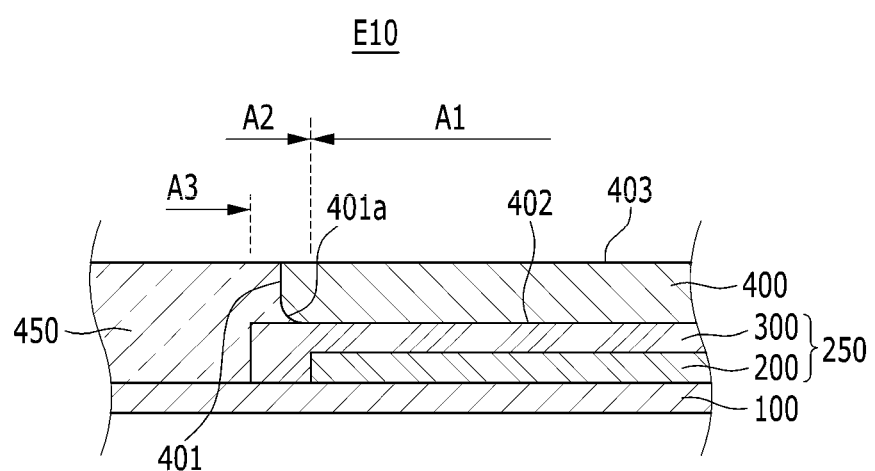
FIG. 4 illustrates an enlarged view of E10 of FIG. 3.

FIG. 1 illustrates a perspective view of a display device according to an exemplary embodiment, FIG. 2 illustrates an enlarged view of some of the display device of FIG. 1 from which a passivation layer is removed, FIG. 3 illustrates a cross-sectional view taken along line II-II of FIG. 1, and FIG. 4 illustrates an enlarged view of E10 of FIG. 3.

Referring to FIG. 1 to FIG. 4, a display device 10 according to an exemplary embodiment of the present disclosure includes a substrate 100, a display member 250, an anti-reflective layer 400, and a passivation layer 450.

The substrate 100 includes a display area A1 and a peripheral area A2.

A display element layer 200 is positioned in the display area A1 which is an area displaying an image. The peripheral area A2 is positioned at an outer circumference of the display area A1, and includes a bending area A3 in which the substrate 100 is bent.

The bending area A3 is bent based on a bending axis X, and has a curvature greater than about 0. In the present exemplary embodiment, the bending area A3 means an area in which its curvature starts from about 0 at one point, gradually increases, and then decreases to another point just before it becomes about 0.

In FIG. 3, the bending area A3 is positioned at a left side of the substrate 100 and a curved portion of the bending area A3 is bent to be formed in a left direction, but the bending area A3 may be positioned at a right side of the substrate 100 and the curved portion of the bending area A3 may be bent to be formed in a right direction.

The substrate 100 may be made of a flexible material to be bendable. For example, the substrate 100 may be formed to be a film type including one of a polyester-based polymer, a silicon-based polymer, an acryl-based polymer, a polyolefin-based polymer, and a copolymer thereof. Specifically, the substrate 100 may include one of polyethylene terephthalate (PET), polybutylene terephthalate (PBT), polysilane, polysiloxane, polysilazane, polycarbosilane, polyacrylate, polymethacrylate, poly(methyl acrylate), poly (ethyl acrylate), poly(ethyl methacrylate), a cyclic olefin copolymer (COC), a cyclic olefin polymer (COP), polyethylene (PE), polypropylene (PP), polyimide (PI), poly(methyl methacrylate) (PMMA), polystyrene (PS), polyacetal (POM), polyether ether ketone (PEEK), polyethersulfone (PES), polytetrafluoroethylene (PTFE), polyvinyl chloride (PVC), polycarbonate (PC), polyvinylidene fluoride (PVDF), perfluoroalkyl (PFA), a styrene acrylonitrile (SAN) copolymer, and combinations thereof.

In a present exemplary embodiment, a display panel including the display member 250 positioned on the substrate 100 may be one of various display panels such as a light emitting display panel, a liquid crystal display panel, and a plasma display panel, but is not limited thereto, and may be one of other panels.

The display member 250 includes the display element layer 200 positioned in the display area A1 of the substrate 100, and a thin film encapsulation layer 300 covering the display element layer 200 and some of the peripheral area A2. The display element layer 200 is provided on the substrate 100, and includes an element area in which an active element such as a thin film transistor (TFT) is formed and a light emitting area in which an emission layer including an organic material and/or an inorganic material is formed. For example, a light emitting area may be formed with an organic light emitting element. That is, the organic light emitting element includes a pixel electrode, a common electrode, and an emission layer positioned therebetween, and one of the pixel electrode and the common electrode injects holes into the emission layer and the other thereof injects electrons into the emission layer. The electrons and the holes are combined in the emission layer to generate excitons, and the generated excitons are changed to a ground state from an excited state, releasing energy to emit light. The element area and the light emitting area are positioned to be separated from each other or to overlap each other.

The thin film encapsulation layer 300 may be positioned on the display element layer 200 to cover and protect the substrate 100 and the display element layer 200. The thin film encapsulation layer 300 may protect the display element layer 200 by preventing oxygen and moisture from entering from the outside. The thin film encapsulation layer 300 may include at least one metal thin film layer and at least one dielectric layer that are alternately stacked.

The anti-reflective layer 400 for improving display quality by preventing reflection of external light is positioned on the thin film encapsulation layer 300. A structure of the anti-reflective layer 400 will be described in detail later.

The passivation layer 450 is positioned in the peripheral area A2 of the substrate 100, and is adjacent to one end portion of the display member 250 and to one end portion of the anti-reflective layer 400. End portions of the anti-reflective layer 400 correspond to predetermined areas of edges of the anti-reflective layer 400. As shown in FIG. 1, when the anti-reflective layer 400 has a quadrangular shape in a plan view, the anti-reflective layer has four end portions.

In a present exemplary embodiment, the passivation layer 450 ranges from one end portion of each of the display member 250 and the anti-reflective layer 400 through the bending area A3 to an end portion of a driving circuit chip 500.

The passivation layer 450 allows a strain applied to the substrate 100 to not be tensile stress but to be compressive stress by adjusting a neutral plane (NP) thereof at which the strain applied to the substrate 100 is substantially zero when the substrate 100 is bent. Accordingly, the passivation layer 450 minimizes damage of a portion of the substrate 100 corresponding to the bending area A3.

An elastic modulus of the passivation layer 450 may be about 500 MPa to about 100 GPa, but is not limited thereto, and may be varied according to a design condition such as a thickness of the substrate 100 or the like.

The passivation layer 450 may include an acryl or a silicon-based resin, or may include a resin having fine particles. The fine particles, for example, may include a rubber including silica, epoxy, polymer-based nanoparticles such as an epoxy hybrid and the like, or microparticles and the like.

The passivation layer 450 may be formed by coating a composition including the aforementioned materials or by stacking various films including polyethylene terephthalate (PET).

The driving circuit chip 500 generating a driving signal for driving the display member 250 is positioned in the peripheral area A2 of the substrate 100. A printed circuit board (PCB) 600 generating an external signal and transmitting it to the driving circuit chip 500 or the display member 250 is attached to one end portion of the substrate 100.

The anti-reflective layer 400 is positioned on the thin film encapsulation layer 300. Referring to FIG. 4, when viewed as a vertical cross-section (x-z plane of FIG. 1), an end portion of the display member 250 may be formed to protrude more than that of the anti-reflective layer 400. Accordingly, an area in a plane view (x-y plane of FIG. 1) of the display member 250 is formed to be larger than that in a plane view of the anti-reflective layer 400.

The anti-reflective layer generally has a quadrangular shape in a plane view (x-y plane of FIG. 1) and in a cross-sectional view (x-z or y-z plane of FIG. 1), and at least two surfaces forming a corner thereof are perpendicular to each other.

In a conventional manufacturing process of the display device, the anti-reflective layer is stacked by a lamination method using a roller. In this case, although the same pressure is applied to two surfaces of the anti-reflective layer forming the corner, which are perpendicular to each other, since a pressure applied to a peripheral portion of the corner is greater than that applied to an inner portion thereof, a crack may occur at the display member positioned at a lower portion of the anti-reflective layer or the corner of the anti-reflective layer may contract and be deformed.

The present exemplary embodiments have been proposed to solve the problem described above.

The anti-reflective layer 400 includes a pair of first and second surfaces 402 and 403 facing each other, and a plurality of first lateral surfaces 401 for connecting the first surface 402 and the second surface 403.

The anti-reflective layer 400 may have a rectangular or square shape in a plane view (x-y plane of FIG. 1). In this case, the first lateral surface 401 of the anti-reflective layer 400 may have a quadrangular circumference provided with a pair of long sides and a pair of short sides.

In the present exemplary embodiments, an area of the first lateral surface 401 of the anti-reflective layer 400 is larger than that of a virtual surface 405 of the anti-reflective layer 400 cut in a direction parallel to an end portion including the first lateral surface 401 of the anti-reflective layer 400, the virtual surface 405 not intersecting the first lateral surface 401, e.g., the virtual surface 405 may be positioned in the middle of the anti-reflective layer 400 as shown in FIG. 1, but is not limited thereto.

Referring to FIG. 1 and FIG. 4, for example, one of the plurality of first lateral surfaces 401 adjacent to an end portion of the passivation layer 450 is larger than the area of the virtual surface 405 of the anti-reflective layer 400 cut in a direction parallel to one end portion of the anti-reflective layer 400 including the first lateral surfaces 401 (that is, a direction parallel to a y-axis of FIG. 1), the virtual surface 405 not intersecting the first lateral surface 401.

In addition, an area of the first lateral surface 401 adjacent to the passivation layer 450 and an area of the first lateral surface 401 positioned in a direction perpendicular thereto may be larger than that of a virtual surface (not shown) of the anti-reflective layer 400 cut in a direction (an x-axis direction of FIG. 1) parallel to an end portion including the first lateral surface 401 positioned in the direction perpendicular thereto.

That is, an area of the first lateral surface 401 contacting the passivation layer 450 is larger than an area of a cross-sectional virtual surface 405, which is perpendicular to a wide surface (x-y plane of FIG. 1) of the substrate 100 and parallel to a long side of the first lateral surface 401 (that is, a position parallel to a y-axis direction of FIG. 1).

This may be realized by allowing each first lateral surface 401 to include at least one chamfered corner in the anti-reflective layer 400. Alternatively, this may be realized by a method of changing a slope of the first lateral surface 401.

Now, an example in which the first lateral surface 401 includes at least one chamfered corner will be described. For example, each first lateral surface 401 is provided with at least four corners so that it has a quadrangular circumference consisting of a pair of long sides and a pair of short sides. That is, the pair of short sides of a first lateral surface 401 each meet respective adjacent first lateral surfaces 401 to form two corners. One of the pair of long sides meets the first surface 402 to form a corner, and the other thereof meets the second surface 403 to form a corner.

In the present exemplary embodiments, at least one of the aforementioned corners included in the first lateral surface 401 is formed to have a chamfered corner.

FIGS. 5 to 13 illustrate numerous exemplary variations of E10 of FIG. 3.

Hereinafter, structures of the anti-reflective layer 400 will be described in detail with reference to FIGS. 4 to 13.

At least one of the plurality of first lateral surfaces 401 may include at least one chamfered corner 401*a*.

Figure 8:
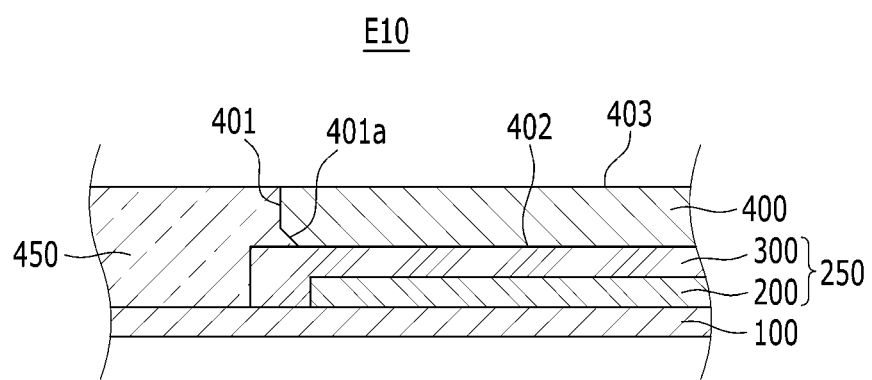

Referring to FIGS. 4 and 8, the first lateral surface 401 may be provided with the chamfered corner 401*a* at a lower portion thereof contacting the display member 250. That is, a corner formed by one of the long sides of the first lateral surface 401 meeting the second surface 403 may be the chamfered corner 401*a*.

Figure 5:
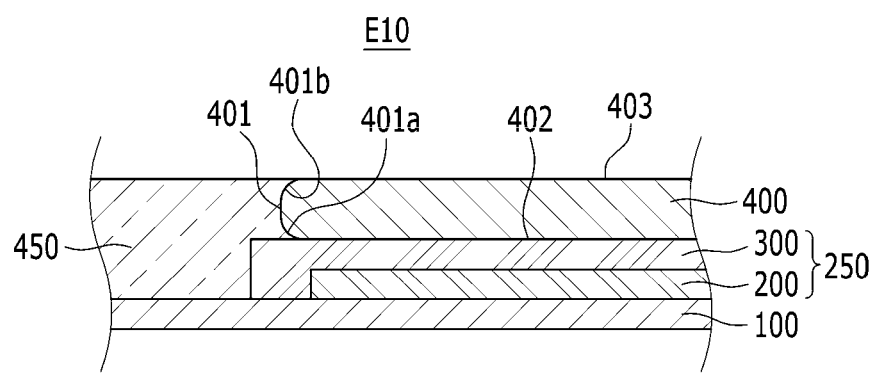
FIGS. 5, 6, 7, 8, 9, 10, 11, 12 and 13 illustrate numerous exemplary variations of FIG. 4.
Figure 9:
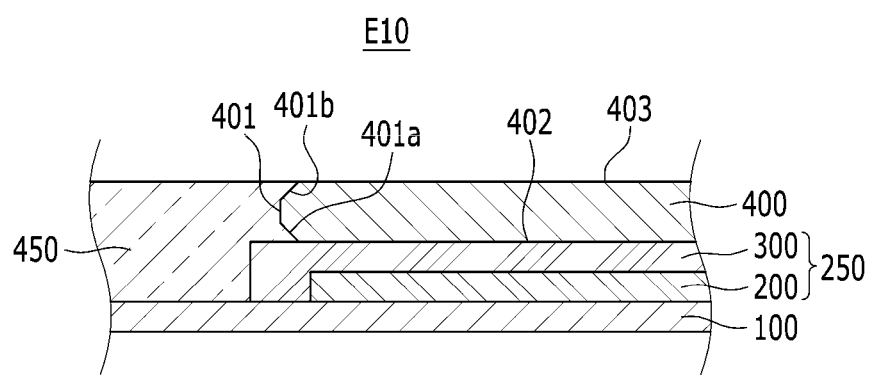

Referring to FIGS. 5 and 9, the first lateral surface 401 may be provided with chamfered corners 401*a* and 401*b* at its lower and upper portions, respectively. That is, a corner formed by one of the long sides of the first lateral surface 401 meeting the first surface 402 may be the chamfered corner 401*a*, and a corner formed by the other of the long sides thereof meeting the second surface 403 may be the chamfered corner 401*b*.

Figure 6:
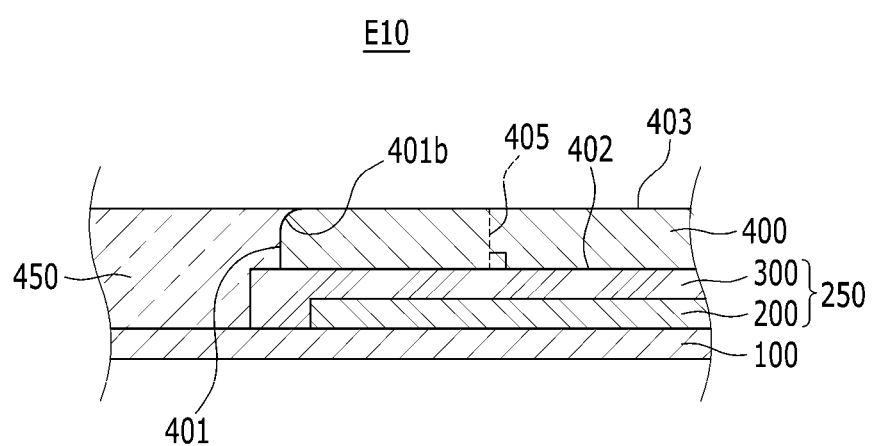
Figure 10:
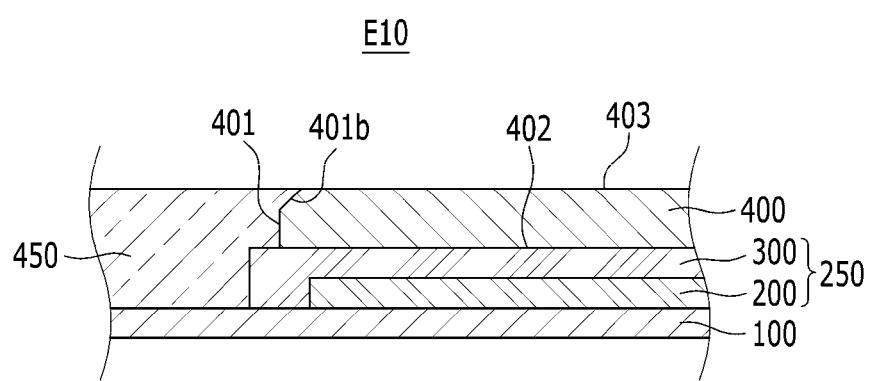

Referring to FIGS. 6 and 10, the first lateral surface 401 may be provided with the chamfered corner 401*b* at its upper portion. That is, a corner formed by one of the long sides of the first lateral surface 401 meeting the second surface 403 may be the chamfered corner 401*b*.

Figure 7:
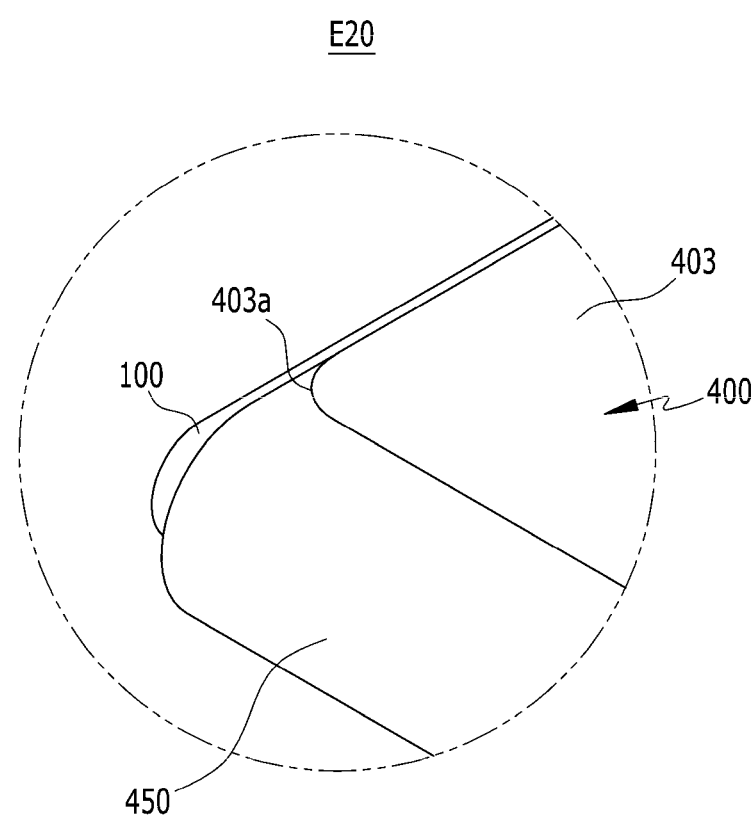
Figure 11:
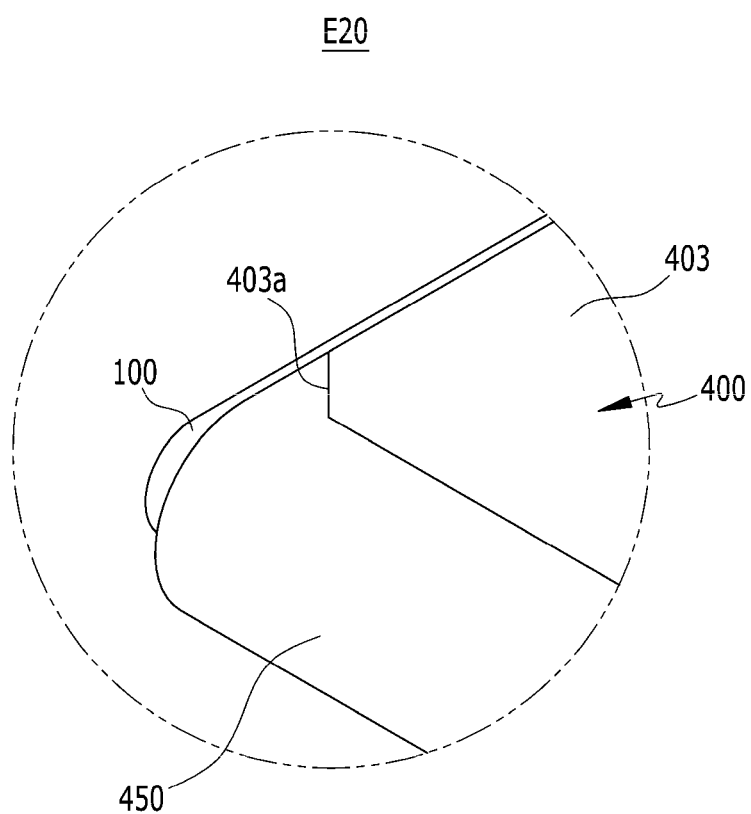

FIGS. 7 and 11 respectively illustrate an enlarged view of E20 of FIG. 1.

Referring to FIGS. 7 and 11, a chamfered corner 403*a* may be provided at a left side of the first lateral surface 401. That is, a corner formed by at least one of the short sides of the first lateral surface 401 meeting the short side of the first lateral surface 401 adjacent thereto may be the chamfered corner 403*a*. Although not illustrated, a chamfered corner may be provided at a right side of the first lateral surface 401.

For example, a cross-sectional shape of the chamfered corner may be at least one of a straight line, a broken line, and a curved line.

For better understanding and convenience, the chamfered corners of which cross-sectional shapes correspond to a curved line are illustrated in FIGS. 4 to 7.

The chamfered corners of which cross-sectional shapes correspond to a straight line are illustrated in FIGS. 8 to 11.

In FIGS. 5 and 9, it is illustrated that the lower and upper chamfered corners 401*a* and 401*b* have the same cross-sectional shape. However, the lower and upper chamfered corners 401*a* and 401*b* may have different shapes. For example, the lower portion of the first lateral surface 401 may be chamfered by a curved line and the upper portion thereof may be chamfered by a straight line, and the lower portion of the first lateral surface 401 may be chamfered by a straight line and the upper portion thereof may be chamfered by a curved line.

Figure 12:
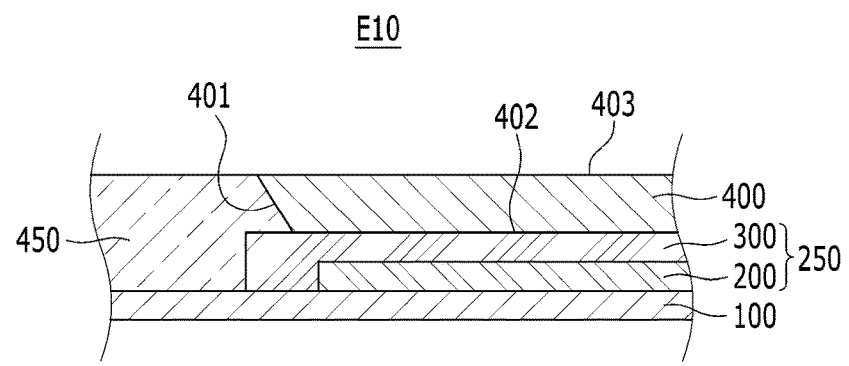
Figure 13:
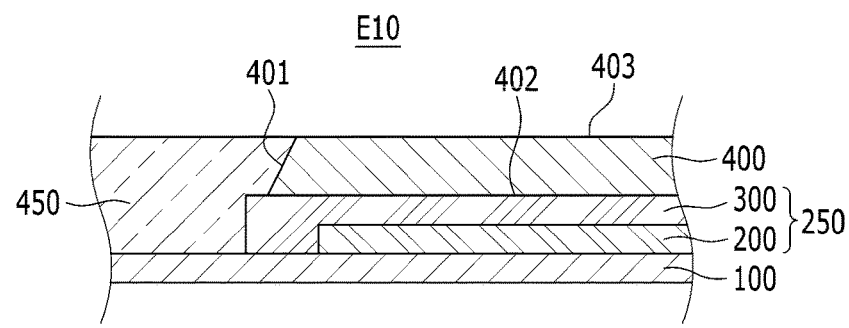

Referring to FIGS. 12 and 13, the first lateral surface 401 may be formed to be inclined with respect to one surface of the substrate 100, that is, a wide surface (x-y plane) thereof. The inclined shape of the first lateral surface 401 may be an inverse taper shape as shown in FIG. 12, or may be a taper shape as shown in FIG. 13.

In the present exemplary embodiments, the first lateral surface 401 of the anti-reflective layer 400 may be provided with at least one chamfered corner 401*a*, or at least one of the first surface 402 and the second surface 403 connected with the first lateral surface 401 may be provided with at least one chamfered corner. The first lateral surface 401 may be formed to be inclined with respect to the substrate 100.

FIGS. 1 to 13 respectively illustrate cases in which at least one of the corners provided at one of the plurality of first lateral surfaces 401 contacting the passivation layer 450 has a chamfered corner, but the remaining first lateral surfaces 401 other than the first lateral surface 401 contacting the passivation layer 450 may be deformed as in FIGS. 4 to 13.

When the anti-reflective layer 400 having the same structure as that of the exemplary embodiment of the present disclosure is attached to the display member 250, it is possible to equalize the pressure applied to the end portion of the anti-reflective layer 400 and the pressure applied to the central portion thereof, thereby preventing crack from occurring at the display member 250, more specifically, at the thin film encapsulation layer 300. Accordingly, it is possible to improve productivity by reducing a defect rate in the manufacturing process of the display device.

Figure 14:
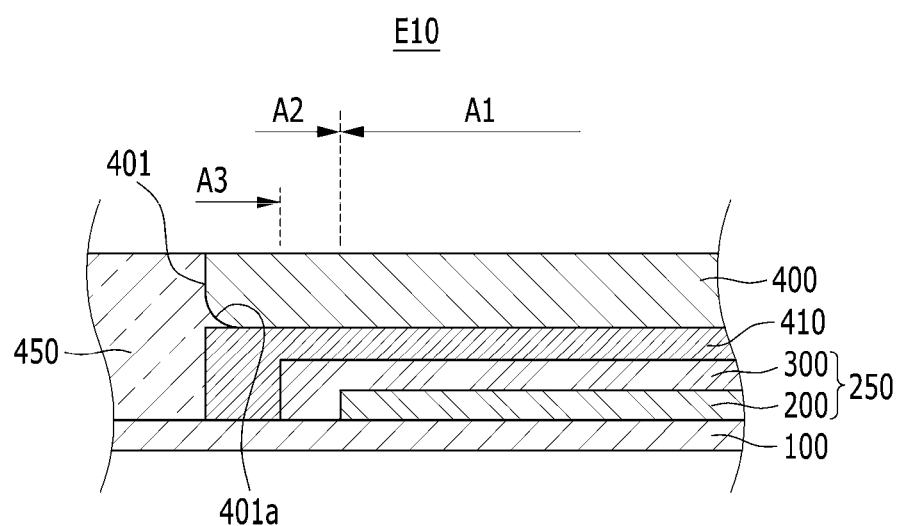
FIG. 14 illustrates a partial cross-sectional view of a display device according to another exemplary embodiment.

FIG. 14 illustrates a partially enlarged cross-sectional view of a display device according to another exemplary embodiment.

Referring to FIG. 14, in the present exemplary embodiment, the anti-reflective layer 400 may extend to contact an end portion of the passivation layer 450 in the bending area A3. That is, the anti-reflective layer 400 may extend to the bending area A3. The anti-reflective layer 400 is attached to the thin film encapsulation layer 300 through a first adhesion layer 410 covering an end portion of the thin film encapsulation layer 300 of the display member 250. The first adhesion layer 410, which attaches the display member 250 and the anti-reflective layer 400 to each other, may be a transparent material.

As such, when the anti-reflective layer 400 extends so that the first lateral surface 401 contacting the passivation layer 450 is positioned in the bending area A3, it is possible to prevent the display quality of the display device from deteriorating due to contraction of the end portion of the anti-reflective layer 400 in the manufacturing process.

In FIG. 14, configurations other than the configuration in which the anti-reflective layer 400 extends to the bending area A3 are the same as those of the display device according to the exemplary embodiment described with reference to FIGS. 1 to 4, thus descriptions thereof will be omitted.

In addition, numerous exemplary variations with respect to at least one of the plurality of first lateral surfaces 401 included in the anti-reflective layer 400 of FIG. 14 are the same as those described with reference to FIGS. 4 to 13, thus descriptions thereof will be omitted.

Figure 15:
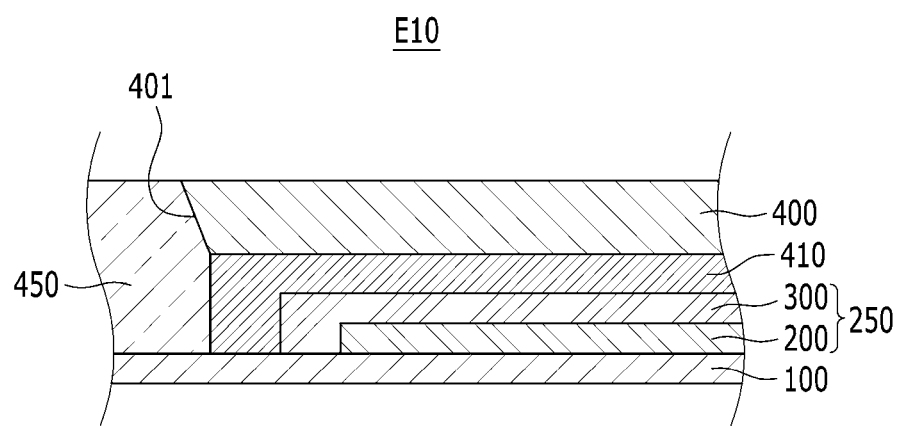
FIGS. 15 and 16 illustrate exemplary variations of FIG. 14.
Figure 16:
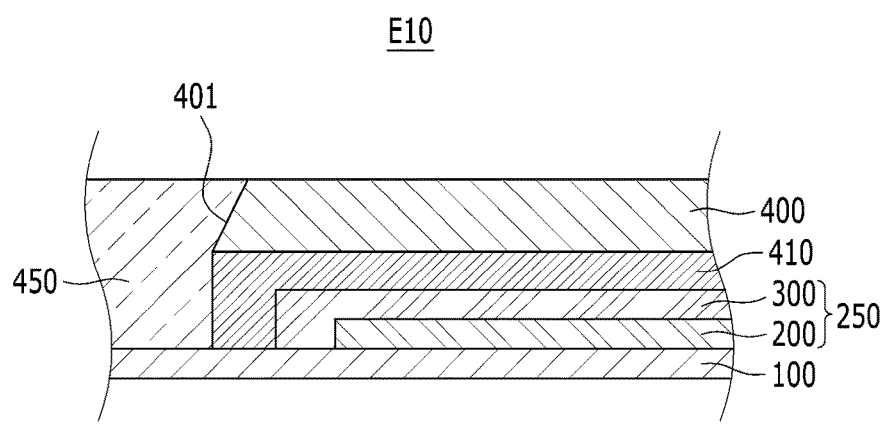

FIGS. 15 and 16 illustrate exemplary variations of FIG. 14.

The first lateral surface 401 of the anti-reflective layer 400 extending to the bending area A3 may be formed to be inclined with respect to one surface (x-y plane of FIG. 1) of the substrate 100. The inclined shape of the first lateral surface 401 may be an inverse taper shape as shown in FIG. 15, or it may be a taper shape as shown in FIG. 16.

Figure 17:
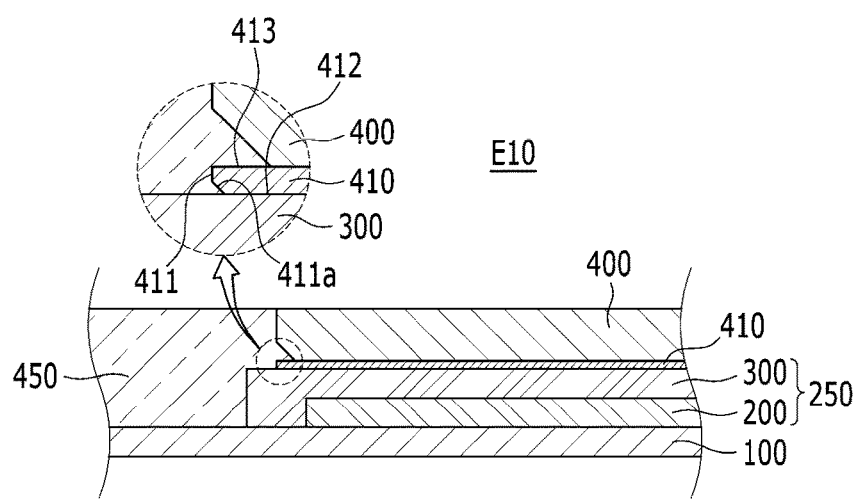
FIG. 17 illustrates a partial cross-sectional view of a display device according to another exemplary embodiment.

FIG. 17 illustrates a partially enlarged cross-sectional view of a display device according to another exemplary embodiment.

In the present exemplary embodiment, the display device may include the first adhesion layer 410 positioned between the display member 250 and the anti-reflective layer 400. The first adhesion layer 410, which attaches the display member 250 and the anti-reflective layer 400 to each other, may be a transparent material.

The first adhesion layer 410 may include a pair of third and fourth surfaces 412 and 413 facing each other, and a plurality of second lateral surfaces 411 for connecting the third surface 412 and the fourth surface 413.

At least one of the plurality of second lateral surfaces 411 may be provided with at least one chamfered corner 411*a*. Numerous exemplary variations with respect to the second lateral surface 411 provided with at least one chamfered corner are the same as those described with reference to FIGS. 4 to 11, thus descriptions thereof will be omitted.

At least one of the plurality of second lateral surfaces 411 may be formed to be inclined with respect to one surface (x-y plane) of the substrate 100. An exemplary variation of the second lateral surface 411 including the inclined surface is the same as those described with reference to FIGS. 12 and 13, thus a description thereof will be omitted.

Figure 18:
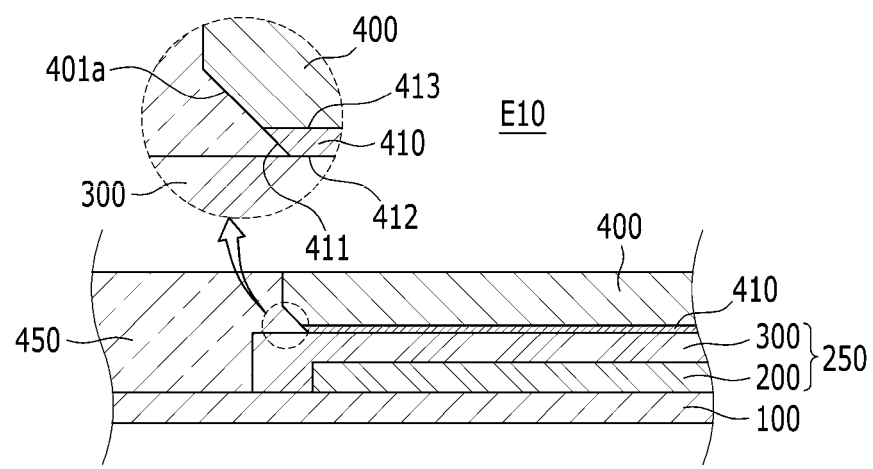
FIG. 18 illustrates an exemplary variation of FIG. 17.

FIG. 18 illustrates an exemplary variation in which the second lateral surface 411 has an inclined shape.

Referring to FIG. 18, the corner 401a chamfered in a linear shape may be provided at a lower portion of the anti-reflective layer 400, and the second lateral surface 411 may be provided with an inclined surface with a shape in which the chamfered corner 401a of the anti-reflective layer 400 extends.

In the present exemplary embodiment and the exemplary variation, configurations other than the configuration in which the first adhesion layer 410 is further included are the same as those of the display device according to the exemplary embodiment described with reference to FIGS. 1 to 4, thus descriptions thereof will be omitted.

Figure 19:
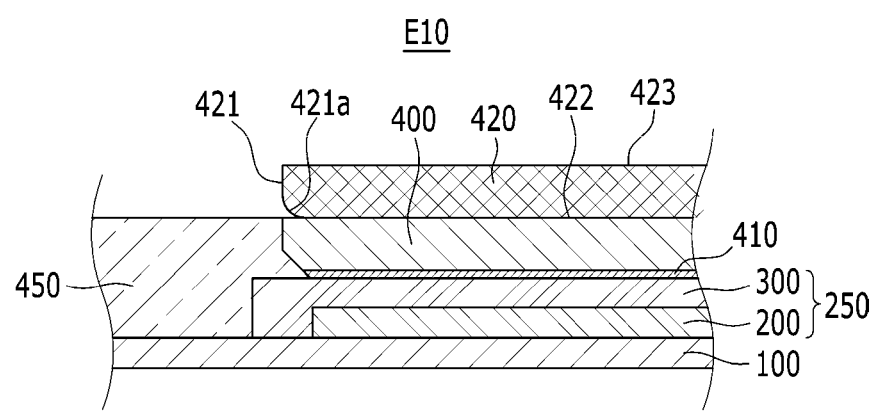
FIGS. 19, 20, 21 respectively illustrate a display device according to another exemplary embodiment.

FIG. 19 illustrates a partially enlarged cross-sectional view of a display device according to another exemplary embodiment.

In the present exemplary embodiment, the display device may include a second adhesion layer 420 positioned on the anti-reflective layer 400. The second adhesion layer 420, which attaches the anti-reflective layer 400 and a cover glass (not shown) for protecting a surface of the display device to each other, may be a transparent material.

The second adhesion layer 420 may include a pair of fifth and sixth surfaces 422 and 423 facing each other, and a plurality of third lateral surfaces 421 for connecting the fifth surface 422 and the sixth surface 423.

At least one of the plurality of third lateral surfaces 421 may be provided with at least one chamfered corner 421a. In addition, at least one of the plurality of third lateral surfaces 421 may be formed to be inclined with respect to one surface (x-y plane) of the substrate 100. Numerous exemplary variations with respect to at least one of the plurality of third lateral surfaces 421 included in the second adhesion layer 420 are the same as those described with reference to FIGS. 4 to 13, thus descriptions thereof will be omitted.

In addition, configurations other than the configuration in which the second adhesion layer 420 is further included are the same as those of the display device according to the exemplary embodiment described with reference to FIGS. 1 to 4, thus descriptions thereof will be omitted.

Figure 20:
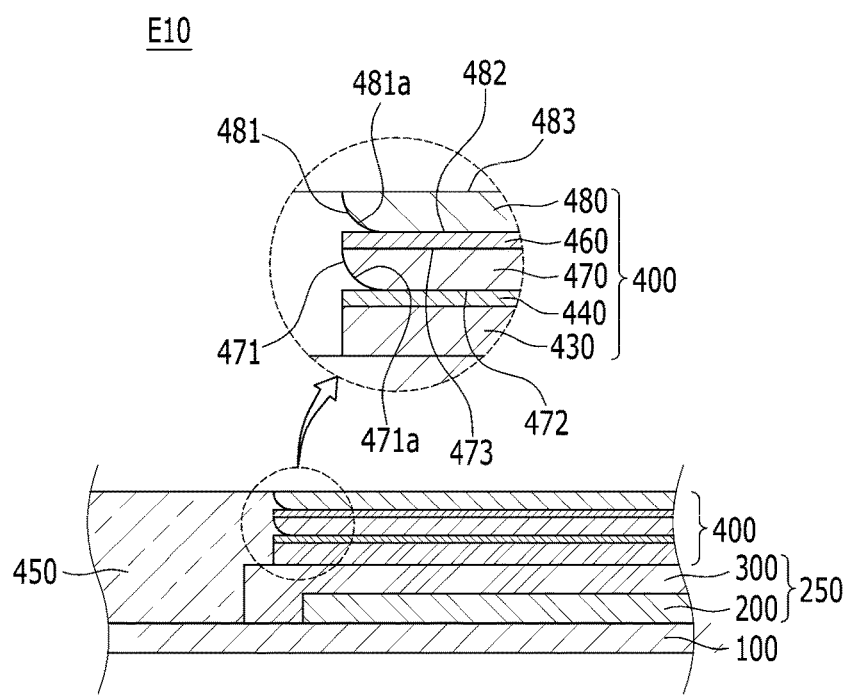

FIG. 20 illustrates a partially enlarged cross-sectional view of a display device according to another exemplary embodiment.

In the present exemplary embodiment, the anti-reflective layer 400 may have a multi-layered structure.

Referring to FIG. 20, the anti-reflective layer 400 of the present exemplary embodiment may have a structure in which a first optical film layer 430, a first protection film layer 470, a second optical film layer 460, and a second protection film layer 480 are sequentially stacked based on the display member 250.

In this case, the first optical film layer 430 and the first protection film layer 470 may be attached with an adhesive 440.

The first optical film layer 430 may be a λ/4 phase retardation film, and it serves to convert linearly polarized light into circularly polarized light or circularly polarized light into linearly polarized light.

The second optical film layer 460, which converts light emitted from the display member 250 into linearly polarized light, may include a polyvinyl alcohol (PVA) layer having a light absorption axis in one axis direction.

The first protection film layer 470 and the second protection film layer 480 are positioned at opposite surface of the second optical film layer 460, respectively. One of the first protection film layer 470 and the second protection film layer 480 may be formed with one of triacetin cellulose (TAC), polyethylene terephthalate (PET), a cycloolefin polymer (COP), an acryl-based polymer, etc., or a mixture thereof.

The first protection film layer 470 may include a pair of seventh and eighth surfaces 472 and 473 and a plurality of fourth lateral surfaces 471 for connecting the seventh surface 472 and the eighth surface 473.

At least one of the plurality of fourth lateral surfaces 471 may include at least one chamfered corner 471a. In addition, at least one of the plurality of fourth lateral surfaces 471 may be formed to be inclined with respect to one surface (x-y plane) of the substrate 100. Numerous exemplary variations with respect to at least one of the plurality of fourth lateral surfaces 471 included in the first protection film layer 470 are the same as those described with reference to FIG. 4 to FIG. 13, thus descriptions thereof will be omitted.

The second protection film layer 480 may include a pair of ninth and tenth surfaces 482 and 483 facing each other, and a plurality of fifth lateral surfaces 481 for connecting the ninth surface 482 and the tenth surface 483.

At least one of the plurality of fifth lateral surfaces 481 may include at least one chamfered corner 481a. In addition, at least one of the plurality of fifth lateral surfaces 481 may be formed to be inclined with respect to one surface (x-y plane) of the substrate 100. Numerous exemplary variations with respect to at least one of the plurality of fifth lateral surfaces 481 included in the second protection film layer 480 are the same as those described with reference to FIG. 4 to FIG. 13, thus descriptions thereof will be omitted.

Configurations other than the configuration in which the anti-reflective layer 400 has the multi-layered structure are the same as those of the display device according to the exemplary embodiment described with reference to FIG. 1 to FIG. 4, thus descriptions thereof will be omitted.

Figure 21:
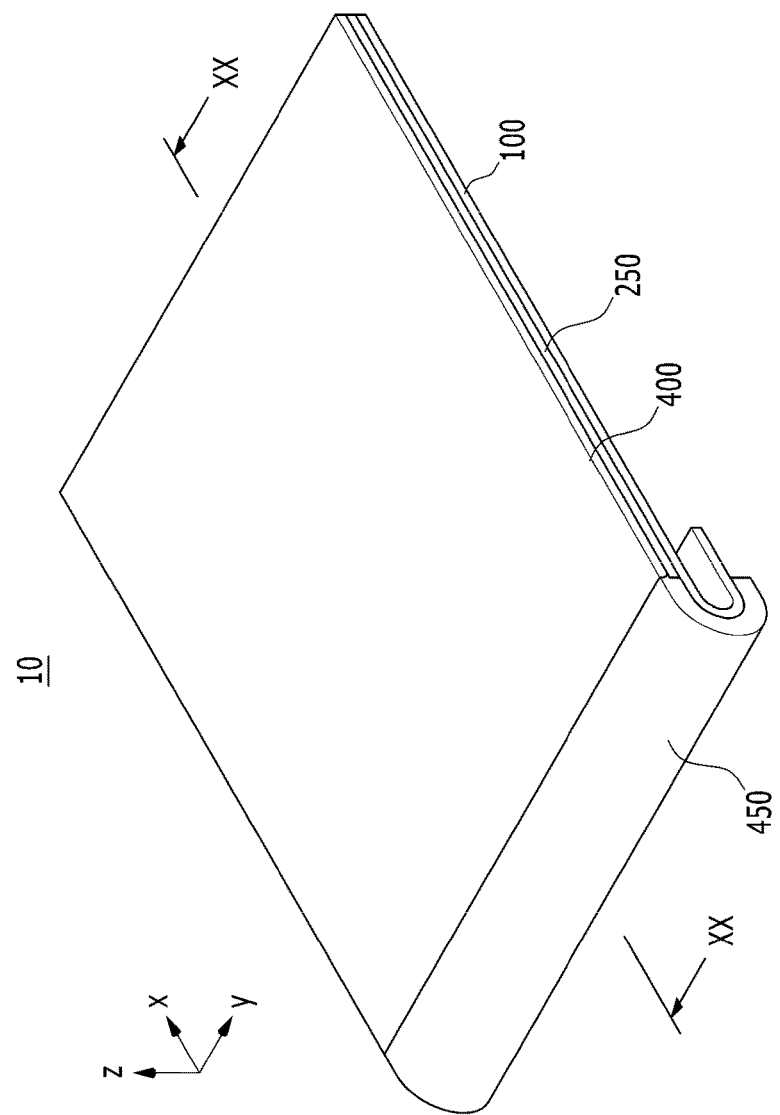
Figure 22:
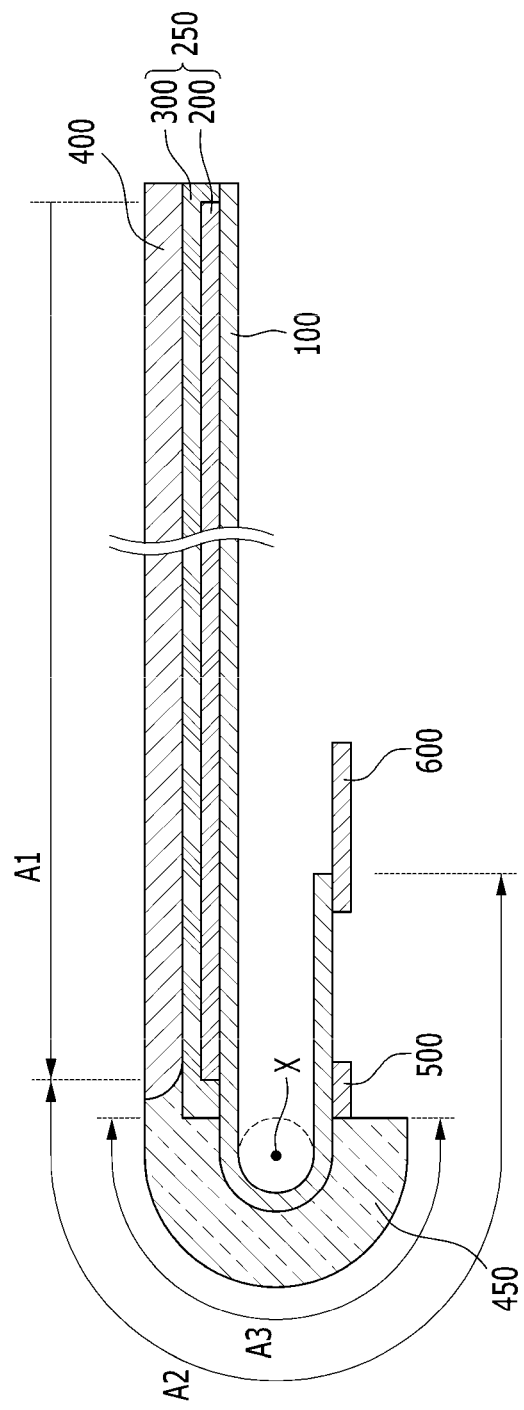
FIG. 22 illustrates a cross-sectional view taken along line XX-XX of FIG. 21.

FIG. 21 illustrates a perspective view of a display device according to another exemplary embodiment, and FIG. 22 illustrates a cross-sectional view taken along line XX-XX of FIG. 21.

Referring to FIGS. 21 and 22, at least one lateral surface of the display device 10 according to the current exemplary embodiment is formed to not have a step.

That is, one lateral surface of the substrate 100, one lateral surface of the display member 250, and the first lateral surface of the anti-reflective layer 400 may be positioned on the same vertical plane (x-z or y-z plane of FIG. 21) at one end portion of the display device 10. This may be realized by cutting their end portions in a state in which the display member 250 and the anti-reflective layer 400 are sequentially stacked on the substrate 100.

Configurations other than the configuration in which at least one lateral surface of the display device 10 of FIGS. 21 and 22 is formed to not have a step are the same as those of the display device according to the exemplary embodiment described with reference to FIGS. 1 to 4, thus descriptions thereof will be omitted.

In addition, the numerous exemplary variations of the anti-reflective layer 400 described with reference to FIGS. 4 to 13 and the display devices described with reference to FIG. 14 to FIG. 20 may be similarly applied to the present exemplary embodiment.

According to the exemplary embodiments of the present disclosure, although a roll or roller is used during the manufacturing process, it is possible to equalize the pressures applied to the edge portions and the central portion of each layer positioned at the display panel, thereby preventing the defect in the manufacturing process such as the crack occurring at the lower portion of the display panel. Accordingly, it is possible to prevent the display panel from being damaged during the manufacturing process, thereby improving productivity thereof and ensuring a display panel having excellent quality.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: display device
100: substrate
250: display member
400: anti-reflective layer
450: passivation layer
401: first lateral surface
410: first adhesion layer
420: second adhesion layer

What is claimed is:

1. A display device comprising:
a substrate configured to include a display area and a peripheral area positioned at an outer circumference of the display area;
a display member positioned on the substrate;
an anti-reflective layer positioned on the display member; and
a passivation layer positioned in a peripheral area of the substrate and to be adjacent to one end portion of the anti-reflective layer,
wherein the anti-reflective layer includes a plurality of first lateral surfaces, and
an area of one of the plurality of first lateral surfaces contacting the passivation layer is larger than an area of a virtual surface of the anti-reflective layer, the virtual surface being a cut in the anti-reflective layer in a direction parallel to one end portion of the anti-reflective layer.

2. The display device of claim 1, wherein an area of at least one of the plurality of first lateral surfaces is larger than an area of a virtual surface of the anti-reflective layer, the virtual surface being a cut in the anti-reflective layer in a direction parallel to one end portion of the anti-reflective layer including at least one first lateral surface, the virtual surface not intersecting the at least one first lateral surface.

3. The display device of claim 1, wherein at least one of the plurality of first lateral surfaces includes at least one chamfered corner.

4. The display device of claim 3, wherein a vertical cross-sectional shape of the chamfered corner is at least one of a straight line, a broken line, and a curved line.

5. The display device of claim 1, wherein at least one of the plurality of first lateral surfaces is inclined with respect to the substrate.

6. The display device of claim 1, wherein the peripheral area comprises a bending area, and the anti-reflective layer extends for the first lateral surface contacting the passivation layer to be positioned in the bending area.

7. The display device of claim 1, further comprising a first adhesion layer positioned between the display member and the anti-reflective layer and to include a plurality of second lateral surfaces.

8. The display device of claim 7, wherein at least one of the plurality of second lateral surfaces includes at least one chamfered corner.

9. The display device of claim 8, wherein a vertical cross-sectional shape of the chamfered corner is at least one of a straight line, a broken line, and a curved line.

10. The display device of claim 7, wherein at least one of the plurality of second lateral surfaces is inclined with respect to the substrate.

11. The display device of claim 1, further comprising a second adhesion layer configured to be positioned on the anti-reflective layer and to include a plurality of third lateral surfaces.

12. The display device of claim 11, wherein at least one of the plurality of third lateral surfaces includes at least one chamfered corner.

13. The display device of claim 12, wherein a vertical cross-sectional shape of the chamfered corner is at least one of a straight line, a broken line, and a curved line.

14. The display device of claim 12, wherein at least one of the plurality of third lateral surfaces is inclined with respect to the substrate.

15. The display device of claim 1, wherein the anti-reflective layer includes a first optical film layer, a first protection film layer, a second optical film layer, and a second protection film layer being sequentially stacked based on the display member.

16. The display device of claim 15, wherein the first protection film layer includes a plurality of fourth lateral surfaces, and at least one of the plurality of fourth lateral surfaces includes at least one chamfered corner.

17. The display device of claim 15, wherein the first protection film layer includes a plurality of fourth lateral surfaces, and at least one of the plurality of fourth lateral surfaces is inclined with respect to the substrate.

18. The display device of claim 15, wherein the second protection film layer includes a plurality of fifth lateral surfaces, and at least one of the plurality of fifth lateral surfaces includes at least one chamfered corner.

19. The display device of claim 15, wherein the second protection film layer includes a plurality of fifth lateral surfaces, and at least one of the plurality of fifth lateral surfaces is inclined with respect to the substrate.

20. The display device of claim 1, wherein
at least one of a plurality of lateral surfaces of the substrate, at least one of a plurality of lateral surfaces of the display member, and at least one of the plurality of first lateral surfaces of the anti-reflective layer are positioned in a same vertical plane.

\* \* \* \* \*